(12) United States Patent
Yang et al.

(10) Patent No.: US 8,451,912 B2
(45) Date of Patent: *May 28, 2013

(54) METHOD AND SYSTEM FOR OPTIMIZING QUANTIZATION FOR NOISY CHANNELS

(75) Inventors: En-Hui Yang, Waterloo (CA); Haiquan Wang, Hangzhou (CN); Xiang Yu, Kitchener (CA)

(73) Assignee: Research In Motion Limited, Waterloo, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 13/463,967

(22) Filed: May 4, 2012

(65) Prior Publication Data

US 2012/0213298 A1    Aug. 23, 2012

Related U.S. Application Data

(63) Continuation of application No. 12/371,127, filed on Feb. 13, 2009, now Pat. No. 8,175,169.

(60) Provisional application No. 61/028,956, filed on Feb. 15, 2008.

(51) Int. Cl.
*H04B 14/04*    (2006.01)

(52) U.S. Cl.
USPC .......................................................... 375/243

(58) Field of Classification Search
USPC ............... 375/240, 240.03, 240.22, 242, 243, 375/245; 382/253; 704/222, 230
See application file for complete search history.

(56) References Cited

U.S. PATENT DOCUMENTS

| | | | |
|---|---|---|---|
| 6,516,297 B1 | 2/2003 | Servetto et al. | |
| 6,728,319 B1 | 4/2004 | Nystrom et al. | |
| 2005/0075869 A1 | 4/2005 | Gersho et al. | |
| 2007/0064780 A1 | 3/2007 | Zheng et al. | |
| 2008/0052068 A1* | 2/2008 | Aguilar et al. | 704/230 |
| 2009/0196361 A1* | 8/2009 | Chan et al. | 375/260 |
| 2009/0268809 A1 | 10/2009 | Cordara et al. | |

OTHER PUBLICATIONS

Goldsmith. Andrea J. et al.. "Joint Design of Fixed-Rate Source Codes and Multiresolution Channel Codes", IEEE Translations on Communications, vol. 46, No. 10, Oct. 1998, pp. 1301-1312.

Saffar, Hamidreza Ebrahimzadeh et ai, "COVQ for MAP Hard-Decision Demodulated Channels", IEEE Communications Letters, vol. 13, No. 1, Jan. 2009, pp. 28-30.

Saffar, Hamidreza Ebrahimzadeh, "Channel Optimized Vector Quantization: Iterative Design Algorithms", A Thesis submitted to the Department of Mathematics and Statistics in conformity with the requirements for the degree of Master of Science (Engineering), Queen's University, Kingston, Ontario, Canada, Aug. 2008, 76 pp.

(Continued)

*Primary Examiner* — Don N Vo
(74) *Attorney, Agent, or Firm* — Fish & Richardson P.C.

(57) ABSTRACT

Methods are described for configuring a quantizer to achieve improved end-to-end distortion performance when transmitting encoded source data over a noisy channel. The codebook and partitioning are selected using an iterative process of determining an updated codebook and an updated partition space, where the updated codebook is based, in part, on the average symbol error probability of the channel. Complete knowledge of the transitional probabilities of the channel is not required. Variants of the iterative process are described.

20 Claims, 3 Drawing Sheets

OTHER PUBLICATIONS

Phamdo, Nam et ai, "A Unified Approach to Tree-Structured and Multistage Vector Quantization for Noisy Channels", IEEE Transactions on Information Theory, vol. 39, No. 3, May 1993, pp. 835-850.

Raza, Zahir et al., "Design of Sample Adaptive Product Quantizers for Noisy Channels", IEEE Transactions on Communications vol. 53, No. 4, Apr. 2005, pp. 576-580.

Gadkari, Shrinivas et al., "Robust Vector Quantizer Design by Noisy Channel Relaxation", IEEE Transactions on Communications, vol. 47, No. 8, Aug. 1999, pp. 1113-1116.

J. Balogh and JA Csirik, "Index Assignment for Two-Channel Quantization", IEEE Transactions on Information Theory, vol. 50, Issue 11, pp. 2737-2751, Nov. 2004.

J.C. Belfiore, G. Rekaya, and E. Viterbo, "The Golden Code: A 2×2 Full-Rate Space-Time Code with Nonvanishing Determinants", IEEE Transactions on Information Theory, vol. 51, No. 4, Apr. 2005.

Q. Du, M. Emelianenko, and L. Ju, "Convergence of the Lloyd Algorithm for Computing Centroidal Voronoi Tessellations", SIAM Journal on Numerical Analysis, vol. 44, Issue 1, pp. 102-119, 2006.

N. Farvardin, "A Study of Vector Quantization for Noisy Channels", IEEE Transactions on Information Theory, vol. 36, No. 4, pp. 799-809, Jul. 1990.

N. Farvardin and V. Vaishampayan, "On the Performance and Complexity of Channel-Optimized Vector Quantizers", IEEE Transactions on Information Theory, vol. 37, No. 1, pp. 155-160, Jan. 1991.

A. Mehes and K. Zeger, "Randomly Chosen Index Assignments are Asymptotically Bad for Uniform Sources", IEEE Transactions on Information Theory, vol. 45, No. 2, pp. 788-794, Mar. 1999.

B. Farber and K. Zeger, "Quantizers with Uniform Decoders and Channel-Optimized Encoders", IEEE Transactions on Information Theory, vol. 52, No. 2, pp. 640-661, Feb. 2006.

A. Gersho, "Asymptotically Optimal Block Quantization", IEEE Transactions on Information Theory, vol. IT-25, No. 4, pp. 373-380, Jul. 1979.

B. Hochwald, "Tradeoff Between Source and Channel Coding on a Gaussain Channel", IEEE Transactions on Information Theory, vol. 44, No. 7, pp. 3044-3055, Nov. 1998.

B. Hochwald and K. Zeger, "Tradeoff Between Source and Channel Coding", IEEE Transactions on Information Theory, vol. 43, No. 5, pp. 1412-1424, Sep. 1997.

J. Kieffer, "Uniqueness of Locally Optimal Quantizer for Log-Concave Density and Convex Error Weighting Function", IEEE Transactions on Information Theory, vol. IT-29, No. 1, pp. 42-47, Jan. 1983.

H. Kumazawa, M. Kasahara, and T. Namekawa, "A Construction of Vector Quantizers for Noisy Channels", Electronics and Engineering in Japan, vol. 67-B, No. 4, pp. 39-47, 1984.

S. Lloyd, "Least Squares Quantization in PCM", IEEE Transactions on Information Theory, vol. IT-28, No. 2, pp. 129-137, Mar. 1982.

S. Matloub and T. Weissman, "Universal Zero-Delay Joint Source-Channel Coding", IEEE Transactions on Information Theory, vol. 52, No. 12, pp. 5240-5250, Dec. 2006.

J. Max, "Quantizing for Minimum Distortion", IRE Transactions on Information Theory, vol. IT-6, pp. 7-12, Mar. 1960.

H. Wang, S. Tsaftaris, and A. Katsaggelos, "Joint Source-Channel Coding for Wireless Object-Based Video Communications Utilizing Data Hiding", IEEE Transactions on Image Processing, vol. 15, No. 8, pp. 2158-2169, Aug. 2006.

X. Wu, "On Convergence of Lloyd's Method I", IEEE Transactions on Information Theory, vol. 38, No. 1, pp. 171-174, Jan. 1992.

P. Zador, "Asymptotic Quantization Error of Continuous Signals and the Quantization Dimension", IEEE Transactions on Information Theory, vol. IT-28, No. 2, pp. 139-149, Mar. 1982.

K. Zeger and V. Manzella, "Asymptotic Bounds on Optimal Noisy Channel Quantization Via Random Coding", IEEE Transactions on Information Theory, vol. 40, No. 6, pp. 1926-1938, Nov. 1994.

International Search Report and Written Opinion issued in International Application No. PCT/CA2009/000176 on May 19, 2009; 9 pages.

International Preliminary Report on Patentability issued in International Application No. PCT/CA2009/000176 on Aug. 17, 2010; 6 pages.

* cited by examiner

METHOD AND SYSTEM FOR OPTIMIZING QUANTIZATION FOR NOISY CHANNELS

CROSS-REFERENCE TO RELATED APPLICATIONS

The present application claims priority to U.S. provisional Ser. No. 61/028,956, filed Feb. 15, 2008, and is a continuation of U.S. non-provisional application No. 12/371,127 filed Feb. 13, 2009, and issued as U.S. Pat. No. 8,175,169 on May 8, 2012, and the contents of both applications are hereby incorporated by reference.

FIELD

The present application relates to methods and systems for optimizing quantization for noisy channels and, in particular, to quantizers and methods of configuring quanitizers for noisy channels.

BACKGROUND

A fundamental topic in joint source channel coding is the design and analysis of optimal noisy channel quantization, which generally includes two parts: a vector quantizer (VQ) and an index assignment mapping. In this context the goal of optimization is to minimize the average end-to-end distortion (EED) of the system by properly designing the VQ and index assignment mapping. Given the complete knowledge of a channel, i.e., all transitional probabilities from channel input symbols to channel output symbols, both the VQ and index assignment mapping will impact on the EED.

Previously, the design and analysis of optimal noisy channel quantization were treated separately to a large extent. For example, given the complete knowledge of a channel and a fixed index assignment mapping, two necessary conditions were derived for a VQ to minimize the EED: see H. Kumazawa, M. Kasahara, and T. Namekawa, "A construction of vector quantizers for noisy channels", *Electronics and Engineering in Japan*, Vol. 67-B, No. 4, pp. 39-47, 1984. These two conditions, in general, depend on all transitional probabilities from channel input symbols to channel output symbols and the fixed index assignment mapping, making it difficult to analyze the performance of the corresponding VQ and tandem system. Indeed, the two conditions reveal no new structural information about the optimal noisy channel VQ itself beyond the conventional centroid condition and nearest neighbor condition for a noiseless channel VQ: see S. Lloyd, "Least squares quantization in PCM", *IEEE Trans. on Information Theory*, Vol. IT-28, No. 2, pp. 129-137, March 1982; J. Max, "Quantizing for minimum distortion," *IRE Transactions on Information Theory*, Vol. IT-6, pp. 7-12, March 1960. The performance of VQs designed by an iterative algorithm based on these two conditions (which may be referred to as the KKN algorithm or the Lloyd-Max algorithm) is very sensitive to the variation of channel conditions.

On the other hand, instead of working with a fixed index assignment mapping, Zeger and Manzella investigated the case of random index assignment, where the mapping from the quantization codebook with size N to N channel symbols is chosen from the set of all N! permutations randomly and uniformly, and derived a few high rate asymptotic performance results on noisy channel quantization: K. Zeger, and V. Manzella, "Asymptotic bounds on optimal noisy channel quantization via random coding", *IEEE Trans. on Information Theory, Vol. 40*, No. 6, pp. 1926-1938, November 1994. However, the analysis was carried out based on the assumption that the VQ itself is optimized without considering the channel noise, although VQs jointly designed with the channel conditions have a performance gain over VQs optimized without reference to the channel conditions. As a result, the analysis by Zeger and Manzella did not shed light on how to design optimal noisy channel VQs jointly with the channel conditions. Other related works in joint source channel coding have studied noisy channel quantization mainly from the index assignment point of view.

It would be advantageous to provide new methods for optimizing vector quantizers for noisy channels and the quantizers resulting therefrom.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

Figure 1:
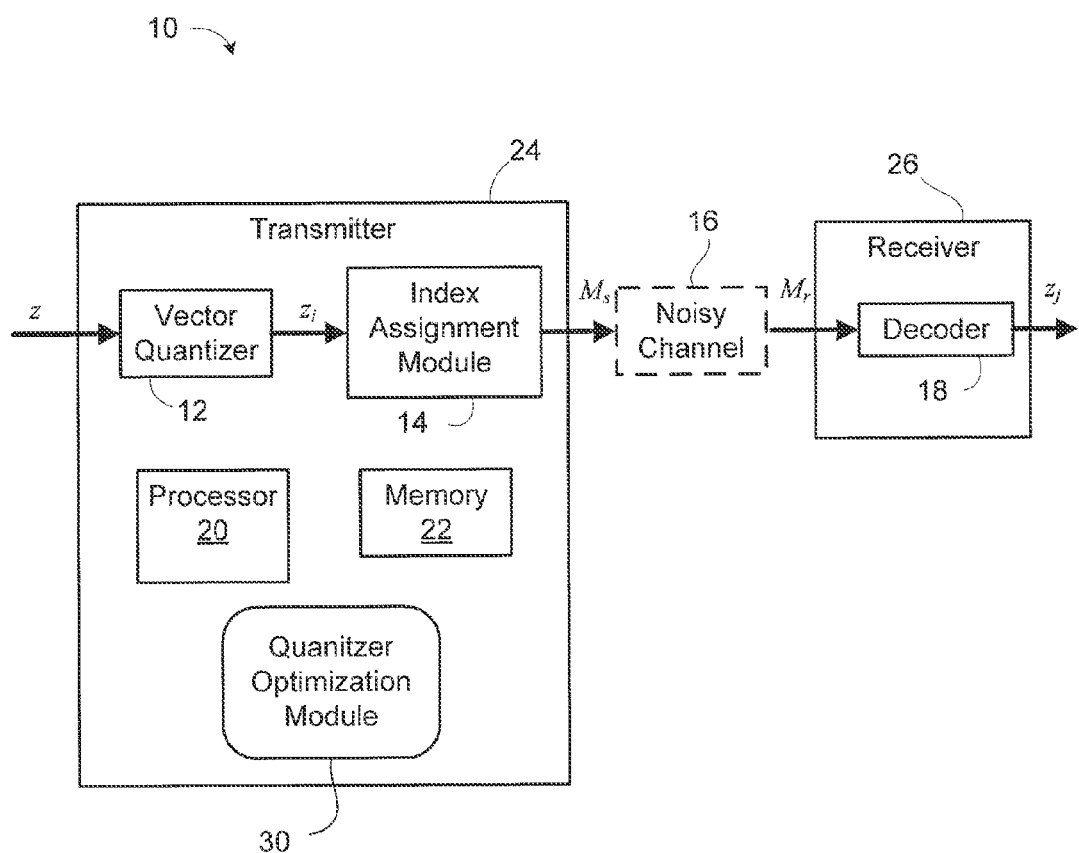
FIG. 1 shows a block diagram of a tandem source channel coding system.

In one aspect, the present application describes a method for configuring a quantizer to be used for quantizing a source vector z for transmission over a noisy channel, the quantizer being configured to perform quantization within a space partitioned into N regions, each region being represented by a quantization codeword $z_i$. The method includes determining an average symbol error probability for the noisy channel; selecting an initial set of quantization codewords and an initial partition of the space into N regions; calculating an updated set of the quantization codewords $z_1$ to $z_N$, based on the partition of the space and on the average symbol error probability; calculating an updated partition of the space into the N regions using the updated set of quantization codewords; iteratively repeating the calculation of the updated set of the quantization codewords and the updated partition of the space until a threshold is met; and configuring the quantizer to perform quantization, after the threshold is met, using the updated partition of the space and the updated set of quantization codewords.

In another aspect, the present application describes a transmitter for transmitting media to a remote location over a noisy channel, wherein the media is a source vector z. The transmitter includes a quantizer configured to receive and quantize the source vector z within a space partitioned into N regions, each region being represented by a quantization codeword $z_i$, thereby producing a quantized source; an index assignment module configured to encode the codewords of the quantized source as symbols in accordance with an index assignment, thereby producing an encoded quantized source for transmission over the noisy channel; and a quantizer optimization module configured to select the quantization codewords and the partitioning of the space. The optimization module is configured to determine an average symbol error probability for the noisy channel, select an initial set of quantization codewords and an initial partition of the space into N regions, calculate an updated set of the quantization codewords $z_1$ to $z_N$, based on the partition of the space and on the average symbol error probability, calculate an updated partition of the space into the N regions using the updated set of quantization codewords, iteratively repeat the calculation of the updated set of the quantization codewords and the updated partition of the space until a threshold is met, and configure the quantizer to perform quantization, after the threshold is met, using the updated partition of the space and the updated set of quantization codewords.

In yet another aspect, the present application discloses a method for configuring a quantizer to be used for quantizing a source for transmission over a noisy channel, the noisy channel having an average symbol error probability, the quantizer being configured to perform quantization using a respective quantization codeword for each region of a partitioned quantization space. The method includes calculating an updated set of the quantization codewords based on the partition of the quantization space and on the average symbol error probability; calculating an updated partition of the quantization space into regions using the updated set of quantization codewords; repeating the calculation of the updated set of the quantization codewords and the updated partition of the quantization space until a threshold is met; and configuring the quantizer to perform quantization, after the threshold is met, using the updated partition of the space and the updated set of quantization codewords.

In a further aspect, the present application discloses a communication device having a memory, a processor, and an application that, when executed, configured the processor to perform one of the methods described above or herein.

Embodiments of the present application are not limited to any particular operating system, network architecture, server architecture, or computer programming language.

Reference is first made to FIG. 1, which shows a tandem source channel coding system 10. The system 10 includes a transmitter 24 that transmits encoded media to a receiver 26. The transmission occurs over a noisy channel 16. It will be appreciated that the transmitter 24 and receiver 26 are configured to send and receive encoded media over a physical layer. Particular embodiments may involve any one of various communications protocols or standards for establishing a communications link between the transmitter 24 and receiver 26, the details of which are not germane to the present application. In some embodiments, the transmitter 24 is part of a wireless communication device, such as a mobile phone or a wireless node, and the receiver 26 is part of a corresponding wireless communication device, such as a mobile phone or a wireless node. The present application is not limited, however, to wireless communications and is applicable to communications between any transmitter and receiver communicating encoded media over a noisy channel.

The transmitter 24 may include a processor 20 and memory 22. As will be understood by those skilled in the art, the processor 20 and memory 22 may be embodied together as a digital signal processing component. The processor 20 and memory 22 may be embodied in a general purpose microprocessor and associated memory. In some instances, the processor 20 and memory 20 are implemented outside the transmitter 24 as part of the general control/processing of a digital device, such a wireless communication device. They are shown as part of the transmitter 24 in FIG. 1 for simplicity.

The transmitter 24 includes a vector quantizer 12 that receives a vector source z and outputs a quantized codeword $z_i$. The transmitter 24 also includes an index assignment module 14 that receives the quantized codewords $z_i$ from the vector quantizer 12 and maps each of them to a channel symbol $M_s$ using an index assignment given by $\pi_t$. The channel symbols $M_s$ are transmitted over a noisy channel 16 to the receiver 26. The receiver 26 includes a decoder 18 that, in part, uses the inverse index assignment $\pi_t^{-1}$ to recover the quantized codeword from a received channel symbol $M_r$.

The quantizer 12 itself may be implemented as a software-based component/module within the transmitter 24. It may be implemented on a dedicated or general purpose computing device. The source vector z represents digital media, such as, for example, audio, images, video, or other media. For example, in a wireless communication device, the source vector z may include digitized voice and/or video captured via a microphone and/or camera input device.

The transmitter 24 may include a quantizer optimization module 30. The quantizer optimization module 30 configures the quantizer 12 to use a particular codebook and partitioning when quantizing the source vector z. As will be described below, the quantizer optimization module 30 may be configured to select a codebook and partitions that achieve a minimum, or close to minimum, EED having regard to the average symbol error probability. Although FIG. 1 illustrates the quantizer optimization module 30 as a separate module within the transmitter 24, it will be understood that it may be part of the quantizer 12 or a module external to the transmitter 24. For example, it may be a software routine or module running on a processor within a wireless device containing the transmitter 24. Other possibilities will be appreciated by those skilled in the art having regard to the following description.

In the examples described herein, z is a k-dimensional real-valued vector source with a probability density function (pdf) $f(z)$ over the k-dimensional Euclidean space $\Lambda$. Without loss of generality, it is assumed that z has a zero mean. The variance of z is denoted as:

$$\sigma^2 = \frac{1}{k}\int_\Lambda |z|^2 f(z)dz$$

The vector quantizer 12 defines a mapping from $\Lambda$ to a set of code vectors (or codewords) called a codebook. Specifically, for an n-bit quantizer Q, its codebook is $\{z_1, \ldots, z_N\}$, where $N=2^n$ is the codebook size. The quantizer 12 partitions the whole vector space $\Lambda$ into N disjoint regions, denoted as $\{A_1, \ldots, A_N\}$, with $\Lambda = \cup_{i=1}^{N} A_i$. The vector quantizer 12 may be understood as performing the following operation:

$$Q(z)=z_i, \text{ if } z \in A_i.$$

The noisy channel 16 is characterized by a matrix of transitional probabilities, which may be defined as:

$$\{p(M_r|M_s), r=1, \ldots, N, s=1, \ldots, N\}$$

where $p(M_r|M_s)$ is the conditional probability that the channel outputs the rth channel symbol given the sth channel symbol is actually sent by the index assignment module 14. As an aside, the quantizer 12 and index assignment module 14 will typically be implemented as part of a transmitter configured to transmit the channel symbols via the noisy channel 16 using some physical layer transmission medium, data link protocols, etc. The present application is not limited to any particular communications protocol or transmission medium.

The index assignment module 14 applies a one-to-one mapping between code vectors $\{z_1, \ldots, z_N\}$ and channel symbols $\{M_1, \ldots, M_N\}$. There are in total N! possible index mappings. Denote a specific index assignment mapping as $\pi_t$, $t \in \{1, \ldots, N!\}$, with $p_t(z_j)=M_r$ and $p_t(z_i)=M_s$. The crossover error probabilities for quantization codewords are related to the channel transitional probabilities as $p_{\pi_t}(\hat{z}=z_j|z \in A_i)=p(M_r|M_s)$, which gives the conditional probability that the receiver outputs $z_j$ as a reconstruction vector given z in $A_i$ is transmitted. For simplicity, the expression $p_{\pi_t}(\hat{z}=z_j|z\in A_i)$ is denoted $p_{\pi_t}(z_j|z_i)$ hereafter. Given the index assignment mapping $\pi_t$, the EED is defined as:

$$D_{\pi_t} \triangleq \frac{1}{k}\sum_{i=1}^{N}\int_{z\in\mathcal{A}_i}\sum_{j=1}^{N}|z-z_j|^2 p_{\pi_t}(z_j|z_i)f(z)dz. \quad (1)$$

From Equation (1), above, it will be appreciated that different index assignment mappings will lead to different distortion between a source z and its reconstruction $\hat{z}$. However, for the purposes of the analysis below a purely random index assignment mapping is assumed. If we assume random selection of the index assignment with equal probability, then the average distortion over all possible index assignments is denoted as $\overline{D}=E_p(D_{p_t})$. The following analysis leads to a closed-form formula for computing $\overline{D}$ for any vector quantizer 12.

EED with Random Index Assignment

If we assume a k-dimensional N-level quantizer Q with $\{A_1, \ldots, A_N\}$, and $\{z_1, \ldots, z_N\}$, and a noisy channel with its transitional probability matrix $p(M_r|M_s)$, the average EED for transmitting a source z with pdf $f(z)$ over the tandem system with random index assignment is:

$$\overline{D} = \left(1 - \frac{Np_{err}}{N-1}\right)D_Q + \frac{Np_{err}}{N-1}s^2 + \frac{Np_{err}}{N-1}S_Q \quad (2)$$

where the average symbol error probability of the channel is given by:

$$p_{err} \triangleq \frac{1}{N}\sum_{s=1}^{N}\sum_{r=1,r\neq s}^{N} p(M_r|M_s)$$

The quantity $D_Q$ in the first term of Equation (2) is the conventional quantization distortion, which is defined as:

$$D_Q \triangleq \frac{1}{k}\sum_{i=1}^{N}\int_{z\in\mathcal{A}_i}|z-z_i|^2 f(z)dz$$

In the second term of Equation (2), the quantity $s^2$ is the source variance. The third term is a structural factor called the scatter factor of the vector quantizer. The scatter factor is defined as:

$$S_Q \triangleq \frac{1}{k\cdot N}\sum_{j=1}^{N}|z_j|^2$$

Equation (2) is derived from Equation (1) as follows:

$$D_{\pi_t} = \frac{1}{k}\sum_{i=1}^{N}\int_{z\in\mathcal{A}_i}\sum_{j=1}^{N}|z-z_j|^2 p_{\pi_t}(z_j|z_i)f(z)dz =$$

$$\frac{1}{k}\sum_{i=1}^{N}\int_{z\in\mathcal{A}_i}\sum_{j=1}^{N}|z-z_i+z_i-z_j|^2 p_{\pi_t}(z_j|z_i)f(z)dz =$$

$$\frac{1}{k}\sum_{i=1}^{N}\int_{z\in\mathcal{A}_i}|z-z_i|^2\sum_{j=1}^{N}p_{\pi_t}(z_j|z_i)f(z)dz +$$

$$\frac{1}{k}\sum_{i=1}^{N}\sum_{j=1}^{N}\int_{z\in\mathcal{A}_i}|z_i-z_j|^2 p_{\pi_t}(z_j|z_i)f(z)dz +$$

$$\frac{2}{k}\sum_{i=1}^{N}\sum_{j=1}^{N}\int_{z\in\mathcal{A}_i}(z-z_i)(z_i-z_j)' p_{\pi_t}(z_j|z_i)f(z)dz =$$

$$D_Q + \frac{1}{k}\sum_{i=1}^{N}\sum_{j=1,j\neq i}^{N}\int_{z\in\mathcal{A}_i}|z_i-z_j|^2 p_{\pi_t}(z_j|z_i)f(z)dz +$$

$$\frac{2}{k}\sum_{i=1}^{N}\sum_{j=1,j\neq i}^{N}\int_{z\in\mathcal{A}_i}(z-z_i)p_{\pi_t}(z_j|z_i)f(z)dz(z_i-z_j)'.$$

In the above, all vectors are row vectors and the transpose is indicated with a prime symbol. The average distortion over all possible index assignment mappings is then equal to:

$$\overline{D} = \quad (3)$$

$$E_p(D_{p_i}) = D_Q + \frac{1}{k}\sum_{i=1}^{N}\sum_{j=1,j\neq i}^{N}\int_{z\in\mathcal{A}_i}|z_i-z_j|^2 E_\pi(p_{\pi_t}(z_j|z_i))f(z)dz +$$

$$\frac{2}{k}\sum_{i=1}^{N}\sum_{j=1,j\neq i}^{N}\int_{z\in\mathcal{A}_i}(z-z_i)E_\pi(p_{\pi_t}(z_j|z_i))f(z)dz(z_i-z_j)'.$$

Taking the average of the cross index probability over all possible index assignment mappings leads to:

$$E_\pi(p_{\pi_t}(\hat{z}=z_{j,j\neq i}|z\in\mathcal{A}_i)) = \frac{1}{N!}\sum_{t=1}^{N!}p_{\pi_t}(\hat{z}=z_{j,j\neq i}|z\in\mathcal{A}_i) = \quad (4)$$

$$\frac{1}{N!}\sum_{s=1}^{N}\sum_{r=1,r\neq s}^{N}p(M_r|M_s)(N-2)! = \frac{1}{N-1}p_{err}$$

Plugging Equation (4) into Equation (3) yields:

$$\overline{D} = D_Q + \frac{1}{k}\frac{p_{err}}{N-1}\left(\sum_{i=1}^{N}\sum_{j=1,j\neq i}^{N}\int_{z\in A_i}|z_i-z_j|^2 f(z)dz\right) +$$

$$\frac{1}{k}\frac{p_{err}}{N-1}\left(2\sum_{i=1}^{N}\sum_{j=1,j\neq i}^{N}\int_{z\in\mathcal{A}_i}(z-z_i)f(z)dz(z_i-z_j)'\right) =$$

$$D_Q + \frac{1}{k}\frac{p_{err}}{N-1}\left(N\sum_{i=1}^{N}|z_i|^2 p(z\in\mathcal{A}_i) +\right.$$

$$\left.\sum_{j=1}^{N}|z_j|^2 - 2\sum_{i=1}^{N}z_i p(z\in\mathcal{A}_i)\sum_{j=1}^{N}z_j'\right) +$$

-continued $$\frac{1}{k}\frac{p_{err}}{N-1}\left(2N\sum_{i=1}^{N}\int_{z\in\mathcal{A}_i}zf(z)dz\,z'_i - 2\sum_{i=1}^{N}\int_{z\in\mathcal{A}_i}zf(z)dz\sum_{j=1}^{N}z'_j - 2N\sum_{i=1}^{N}|z_i|^2p(z\in\mathcal{A}_i) + 2\sum_{i=1}^{N}z_ip(z\in\mathcal{A}_i)\sum_{j=1}^{N}z'_j\right) \stackrel{1}{=}$$

$$D_Q + \frac{1}{k}\frac{p_{err}}{N-1}\left(\sum_{j=1}^{N}|z_j|^2 - N\sum_{i=1}^{N}|z_i|^2p(z\in\mathcal{A}_i) + 2N\sum_{i=1}^{N}\int_{z\in\mathcal{A}_i}zf(z)dz\cdot z'_i\right) \stackrel{2}{=}$$

$$D_Q + \frac{1}{k}\frac{p_{err}}{N-1}\left(\sum_{j=1}^{N}|z_j|^2 + N(k\sigma^2 - kD_Q)\right) =$$

$$\left(1 - \frac{Np_{err}}{N-1}\right)D_Q + \frac{Np_{err}}{N-1}\sigma^2 + \frac{Np_{err}}{N-1}S_Q$$

where $\underline{1}$ is due to the zero mean assumption so that $$\sum_{i=1}^{N}\int_{z\in A_i}zf(z)dz = 0$$

and $\underline{2}$ results from a rewriting of the definition of $D_Q$, that is, $$D_Q = \sigma^2 - \frac{2}{k}\sum_{i=1}^{N}\int_{z\in\mathcal{A}_i}zf(z)dz\cdot z'_i + \frac{1}{k}\sum_{i=1}^{N}|z_i|^2p(z\in\mathcal{A}_i).$$

From Equation (2) it will be noted that the EED comes from three terms: the quantization distortion, the joint impact of channel noise and the source variance, and the joint term of channel noise and the scatter factor of the quantization codebook. Among the three, the scatter factor term $S_Q$ is interesting and new; it represents the energy of the quantization codebook. Intuitively, the more the quantization codewords scatter away from the source mean, the more contribution comes from the channel noise to the EED.

It will be appreciated that Equation (2) is valid for any vector quantizer with random index assignment. From Equation (2), it is also now clear that minimizing $D_Q$ alone does not necessarily reduce the EED. To minimize the EED, a vector quantizer should be configured such that its codewords are spread widely enough to make $D_Q$ small, and at the same time are closely concentrated around the source mean to make $S_Q$ small. It will be appreciated that the optimal solution will be the selection of a partition space and set of codewords that balances these two objectives to achieve a minimum EED.

The attempt to find an optimal set of codewords and an optimal partitioning of the space is a minimization problem. As will be described below, the solution to the minimization problem results in two necessary conditions to be satisfied by an optimal vector quantizer 12.

To find the optimal minimization of EED, define a k-dimensional N-level quantizer Q with its partition $\Gamma=\{A_1,\ldots,A_N\}$ and its codebook $\psi=\{z_1,\ldots,z_N\}$, where $$\bigcup_{i=1}^{N}A_i = \Lambda, \quad \int_{A_i\cap A_j}f(z)dz = 0 \text{ for } i\neq j,$$

and each $z_i$ is used to represent all points in $A_i$. The problem of designing an optimal noisy channel VQ can now be formulated equivalently as the following minimization problem:

$$\min_{\Psi}\min_{\Gamma}\left\{\left(1 - \frac{Np_{err}}{N-1}\right)D_Q + \frac{Np_{err}}{N-1}\sigma^2 + \frac{Np_{err}}{N-1}S_Q\right\}. \quad (5)$$

From the minimization problem defined in Equation (5) the following two conditions may be derived:

$$1.\ z_i = \frac{\int_{z\in\mathcal{A}_i}zf(z)dz}{p(z\in\mathcal{A}_i) + \frac{p_{err}}{N-1-N\cdot p_{err}}},\ i=1,\ldots,N. \quad (6)$$

$$2.\ \mathcal{A}_i = \{z: |z-z_i|^2 \leq |z-z_j|^2,\text{ for all } j\neq i\},\ i=1,\ldots,N. \quad (7)$$

The two conditions given in Equations (6) and (7) are found from the minimization expression of Equation (5) in the following manner. Given the partition $\{A_1,\ldots,A_N\}$, Equation (6) may be found by setting $$\frac{\partial \overline{D}}{\partial z_i} = 0.$$

In particular, $$\frac{\partial \overline{D}}{\partial z_i} = \left(1 - \frac{Np_{err}}{N-1}\right)\frac{\partial D_Q}{\partial z_i} + \frac{Np_{err}}{N-1}\frac{\partial S_Q}{\partial z_i} = \left(1 - \frac{Np_{err}}{N-1}\right)\frac{\partial}{\partial z_i} \quad (8)$$

$$\left(\sigma^2 - \frac{2}{k}\sum_{j=1}^{N}\int_{z\in\mathcal{A}_j}zf(z)dz\cdot z'_j + \frac{1}{k}\sum_{j=1}^{N}|z_j|^2p(z\in\mathcal{A}_j)\right) +$$

$$2z_i\frac{1}{k}\frac{p_{err}}{N-1} = \left(1 - \frac{Np_{err}}{N-1}\right)\frac{1}{k}$$

$$\left(-2\int_{z\in\mathcal{A}_i}zf(z)dz + 2z_i\cdot p(z\in\mathcal{A}_i)\right) + \frac{2}{k}z_i\frac{p_{err}}{N-1}.$$

If we let $$\frac{\partial \overline{D}}{\partial z_i} = 0$$

in the above expression, the result is Equation (6).

It will be noted that, given the codebook $\{z_1,\ldots,z_N\}$, the scatter factor $S_Q$ does not depend on the partition. Applying the nearest neighbor rule then yields Equation (7).

It will be noted that Equation (6) tends to force codewords towards the origin so as to make the scatter factor smaller. Equation (7) is independent of the channel, and Equation (6) depends on the channel only through the average symbol error probability $p_{err}$. These conditions do not require complete knowledge of the channel, i.e. all transitional probabilities.

Methods for Configuring a Vector Quantizer

Having derived the two conditions reflected in Equations (6) and (7) for minimizing EED, we present below example methods for configuring a vector quantizer based on these two equations. The example methods are iterative processes in which the codebook and partitions are updated alternately and iteratively until an update fails to improve the EED (or a related variable) by more than a threshold amount.

Figure 2:
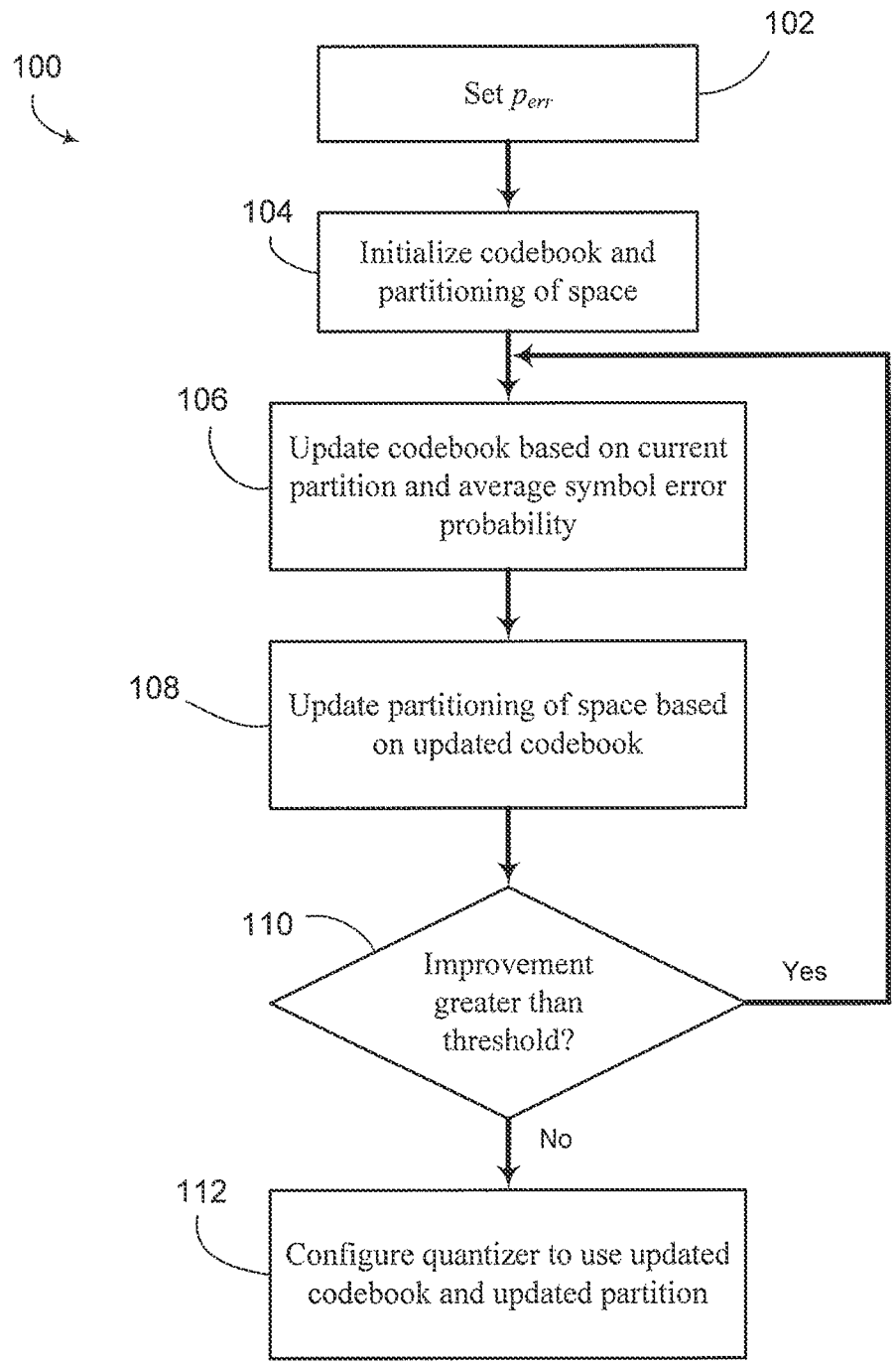
FIG. 2 shows, in flowchart form, an example method of configuring a quantizer.

Reference is now made to FIG. 2, which shows, in flowchart form, an example method 100 of configuring a quantizer. The method 100 begins in step 102 with setting a value for the average symbol error probability $p_{err}$. Then in step 104, the codebook $\{z_1, \ldots, z_N\}$ and partition space $\{A_1, \ldots, A_N\}$ are initialized. In one embodiment, at the physical layer, one may obtain an estimate of $p_{err}$ from the transmission or signal power; it can also be obtained from adaptive channel coding schemes. The average symbol error probability $p_{err}$ is a channel parameter. Empirically, it may be estimated by feeding a number of symbols into the channel, counting the number of erroneously received symbols and computing the ratio. The initialization of the codebook and partition is related to the convergence of the algorithm. For scalar quantization case, the initialization can be arbitrary. In the general case, in one embodiment the output of a Lloyd-Max algorithm as the initialization.

Steps 106 and 108 are performed alternately and iteratively. In step 106, an update to the codebook $\{z_1, \ldots, z_N\}$ is calculated based on the current partition $\{A_1, \ldots, A_N\}$ and the average symbol error probability $p_{err}$. In step 108, the updated codebook is used to calculate an updated partition.

In step 110, a quantity is evaluated based on at least the updated codebook. If the quantity has changed/improved by at least a threshold amount, then the method 100 goes back to step 106 to repeat the updates. If the quantity has not improved by more than a threshold amount, then the method 100 continues to step 112, where the quantizer is configured using the updated versions of the codebook $\{z_1, \ldots, z_N\}$ and partition $\{A_1, \ldots, A_N\}$.

In one embodiment the quantity evaluated in step 110 is the EED. The EED may be calculated, for example using Equation (2), and compared to the EED from the previous iteration. If there has not been at least a threshold change in the EED from the previous iteration then the method 110 goes to step 112 and uses the current updated codebook and partition for quantization.

In another embodiment, the quantity evaluated in step 110 is the sum of the magnitude of the changes in the updated codewords. For example, the following expression could be used:

$$s = \frac{1}{N} \sum_{i=1}^{N} |z_i^{t+1} - z_i^t|^2$$

Where s represents the average change in magnitude of the updated codewords. In step 110, the quantity s may be compared with a predetermined threshold and, if it has not changed by more than the predetermined threshold, the iterative loop is ended and the method 100 goes to step 112.

Those skilled in the art will appreciate the other quantities that may be evaluated in step 110 to determine whether to stop the iterative loop because no further appreciable gains will be realized.

With specific reference to Equations (6) and (7) determined above, an example embodiment of the method 100 may be described as follows. The following example embodiment of the method may be referred to as the "greedy iterative" method.

The space is partitioned as $\Gamma = \{A_1, \ldots, A_N\}$ and the codebook is defined as $\psi = \{z_1, \ldots, z_N\}$. An index value t is initialized as t=1. In step 102, the average symbol error probability $P_{err}$ is determined, measured, or otherwise selected. In step 104, the initial values for the codebook and partition are selected as $\{z_1^{(1)}, \ldots, z_N^{(1)}\}$ and $\{A_1^{(1)}, \ldots, A_N^{(1)}\}$, respectively. Based on these initial values, the EED, or the average EED $\overline{D}^{(1)}$, is calculated. The calculation of average EED may be based on Equation (2), for example.

In step 106, given the partition $\{A_1^{(1)}, \ldots, A_N^{(1)}\}$, the codebook is updated in accordance with the Equation (6) for t=t+1 as follows:

$$z_i^{(t+1)} = \frac{\int_{z \in \mathcal{A}_i^{(t)}} z f(z) dz}{p(z \in \mathcal{A}_i^{(t)}) + \frac{p_{err}}{N - 1 - N \cdot p_{err}}}, \quad i = 1, \ldots, N. \tag{9}$$

Then, in step 108, given the updated codebook $\{z_1^{(t+1)}, \ldots, z_N^{(t+1)}\}$, the partition is updated in accordance with Equation (7) for t=t+1 as follows:

$$A_i^{(t+1)} = \{z : |z - z_i^{(t+1)}|^2 \leq |z - z_j^{(t+1)}|^2, \text{ for all } j \neq i\}, i = 1, \ldots, N. \tag{10}$$

In step 110, the average EED for t=t+1, $\overline{D}^{(t+1)}$, is calculated. If the improvement in EED, given by $\overline{D}^{(t)} - \overline{D}^{(t+1)}$ fails to meet a predefined threshold level, then the updated partition $\{A_1^{(t+1)}, \ldots, A_N^{(t+1)}\}$ and updated codebook $\{z_1^{(t+1)}, \ldots, z_N^{(t+1)}\}$ are recorded and used to configure the quantizer.

The quantizer so configured may then be used to process/quantize the source vector z in accordance with the recorded partition and codebook. The quantizer outputs the quantized source vector, which, as shown in FIG. 1, is then mapped through an index assignment into channel symbols which are then transmitted through the noisy channel.

Figure 3:
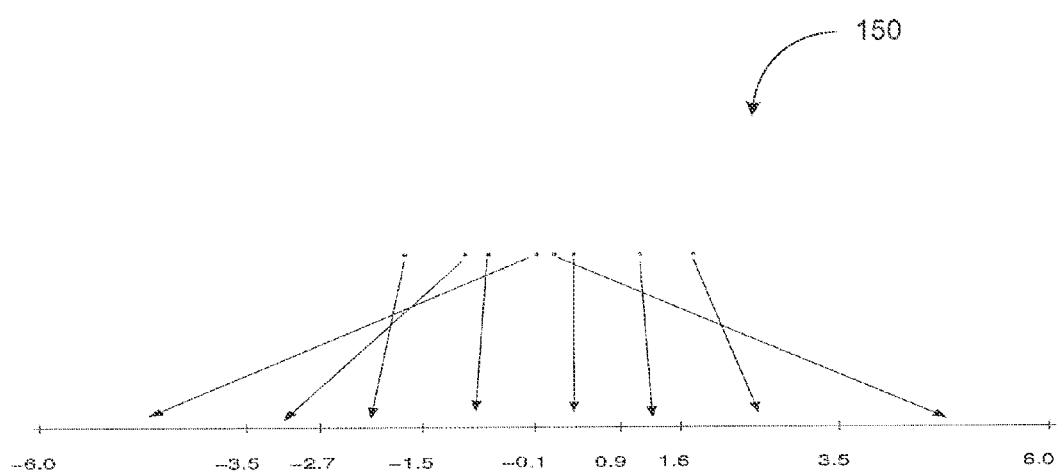
FIG. 3 shows a graph for a partition and codebook at a step in the iterative process for configuring the quantizer.

Those skilled in the art will recognize from the present description that the above-described "greedy iterative" method may result in an updated $z_i$ at step 106 that does not fall within $A_i$, especially when $$\frac{p_{err}}{N - 1 - N \times p_{err}}$$

is greater than $p(z \in A_i)$. Reference is now made to FIG. 3, which shows a graph 150 for a partition and codebook at some step in the above iterative process when applied to a one-dimensional Gaussian source with zero mean and unit variance and a noisy channel with $p_{err} = 0.05$. The horizontal axis of the graph 150 shows the partition, while the dots and arrows represent the updating of the quantization outputs $z_i$ given the partition. As shown by the arrows, there are three partition sets, for which the respective updated quantization output points are brought outside each respective set, i.e., the first, second, and the last. Therefore, the subsequent alternating steps will make $\{z_1, \ldots, z_8\}$ and $\{A_1, \ldots, A_8\}$ appear in random order along the horizontal line. This in turn will make it difficult to analyze the convergence of the corresponding sequence of quantizers.

To address this issue, the "greedy iterative" method can be adapted by imposing the condition that $z_i^{(t+1)} \in A_i^{(t)}$, which leads to a "controlled iterative" method of configuring the quantizer. When this condition is imposed we cannot find the closed-form solution represented by Equation (9). Rather, we arrive at the following expression for updating the codebook:

$$\hat{z}_i^{(t+1)} = \arg\min_{\hat{z} \in \mathcal{A}_i^{(t)}} \left(1 - \frac{Np_{err}}{N-1}\right) \int_{z \in \mathcal{A}_i^{(t)}} |z - \hat{z}|^2 f(z)dz + \frac{p_{err}}{N-1}|\hat{z}|^2. \quad (11)$$

We arrive at Equation (11) by way of the following constrained optimization problem:

$$\min_{z_i, i=1,\ldots,N} \overline{D} \text{ subject to } z_i \in A_i, i = 1, \ldots, N$$

The solution to this problem will be Equation (6) only if there exists a point within $A_i$ such that $$\frac{\partial \overline{D}}{\partial z_i} = 0.$$

Note that the objective function in (11) is actually a convex function with respect to $\hat{z}$. Therefore, one can apply a standard method to solve this constrained convex optimization problem. In practise, however, one can further use the following simplified method to update $z_i^{(t)}$ in step 106 of the "controlled iterative" method. If:

$$\frac{\int_{z \in \mathcal{A}_i^{(t)}} zf(z)dz}{p(z \in \mathcal{A}_i^{(t)}) + \frac{p_{err}}{N-1-N \cdot p_{err}}}$$

lies in $A_i^{(t)}$, then update $z_i^{(t)}$ according to (9); otherwise, compute the point at the intersection between the boundary of $A_i^{(t)}$ and the line segment connecting $z_i^{(t)}$ and:

$$\frac{\int_{z \in \mathcal{A}_i^{(t)}} zf(z)dz}{p(z \in \mathcal{A}_i^{(t)}) + \frac{p_{err}}{N-1-N \cdot p_{err}}}$$

and take that point as $z_i^{(t+1)}$.

Note that both the greedy iterative method and the controlled iterative method converge in the sense that the sequences of $\overline{D}^{(t)}$ are non-increasing as $t \to \infty$.

It will be appreciated that the foregoing methods and quantizers may be configured upon provisioning/installation based on a predefined source vector z. In some embodiments, the quantizer is reconfigured for each source vector z. In other embodiments, the quantizer is reconfigured if a change is expected or detected in the characteristics of the noisy channel through which the quantizer/transmitter will be sending data. Other circumstances in which it would be advantageous to use the described methods/processes to configured a quantizer will be appreciated by those ordinarily skilled in the art.

It will be understood that the quantizer described herein and the module, routine, process, thread, or other software component implementing the described method/process for configuring the quantizer may be realized using standard computer programming techniques and languages. The present application is not limited to particular processors, computer languages, computer programming conventions, data structures, other such implementation details. Those skilled in the art will recognize that the described processes may be implemented as a part of computer-executable code stored in volatile or non-volatile memory, as part of an application-specific integrated chip (ASIC), etc.

Certain adaptations and modifications of the described embodiments can be made. Therefore, the above discussed embodiments are considered to be illustrative and not restrictive.

What is claimed is:

1. A method for configuring a quantizer to be used for quantizing a source signal for transmission over a noisy channel, the noisy channel having an average symbol error probability, the quantizer being configured to perform quantization using a respective quantization codeword for each region of a partitioned quantization space, the method comprising:
   calculating an updated set of the quantization codewords based on the partition of the quantization space and on the average symbol error probability;
   calculating an updated partition of the quantization space into regions using the updated set of quantization codewords;
   repeating the calculation of the updated set of the quantization codewords and the updated partition of the quantization space until a threshold is met; and
   configuring the quantizer to perform quantization, after the threshold is met, using the updated partition of the space and the updated set of quantization codewords.

2. The method claimed in claim 1, wherein the threshold is met if an incremental change in the updated codewords is smaller than a preselected value.

3. The method claimed in claim 1, further including calculating distortion based on the updated quantization codewords for each iteration, and wherein the threshold is met if the incremental change in the distortion is smaller than a preselected value.

4. The method claimed in claim 1, wherein calculating an updated set of the quantization codewords, comprises, for each codeword, calculating the mean of the source signal within the respective region of the partitioned quantization space, and wherein the calculation of the mean of the source signal includes the average symbol error probability as a factor.

5. The method claimed in claim 4, wherein calculating the mean of the source signal includes applying a condition that each updated codeword lie within its respective $i^{th}$ region of the partitioned quantization space.

6. The method claimed in claim 1, wherein calculating an updated set of the quantization codewords comprises finding, for each region i, an updated codeword $z_i$ in accordance with:

$$z_i^{(t+1)} = \frac{\int_{z \in \mathcal{A}_i^{(t)}} zf(z)dz}{p(z \in \mathcal{A}_i^{(t)}) + \frac{p_{err}}{N-1-N \cdot p_{err}}}, i = 1, \ldots, N.$$

wherein t is an index of the iteration, $p_{err}$ is the average symbol error probability, $f(z)$ is the probability density function of the source signal, $A_i^{(t)}$ is region i, and $p(z \in A_i^{(t)})$ is the probability that the source signal lies within the region i.

7. The method claimed in claim 6, wherein the probability density function $f(z)$ is estimated from the empirical distribution of the source and $p(z \epsilon A_i^{(t)})$ is the percentage of the source signal in the region $A_i$.

8. The method claimed in claim 1, wherein calculating an updated set of the quantization codewords comprises finding, for each region $A_i$, an updated codeword $z_i$ in accordance with:

$$z_i^{(t+1)} = \arg\min_{\hat{z} \in \mathcal{A}_i^{(t)}} \left(1 - \frac{Np_{err}}{N-1}\right) \int_{z \in \mathcal{A}_i^{(t)}} |z - \hat{z}|^2 f(z) dz + \frac{p_{err}}{N-1} |\hat{z}|^2.$$

wherein t is an index of the iteration, $p_{err}$ is the average symbol error probability, $f(z)$ is the probability density function of the source signal, $A_i^{(t)}$ is the i-th region, and $\hat{z}$ is any codeword in $A_i$.

9. The method claimed in claim 1, further comprising quantizing the source signal using the configured quantizer to generate a quantized source signal based on the updated partition of the quantization space and the updated set of quantization codewords.

10. The method claimed in claim 9, further comprising transmitting the quantized source signal.

11. A communications device for coding and transmitting a source signal to a remote location over a noisy channel, the noisy channel having an average symbol error probability, the communications device comprising:
   a memory;
   a processor;
   a quantization application configured to perform quantization using a respective quantization codeword for each region of a partitioned quantization space, wherein the quantization application, when executed by the processor, configures the processor to:
      calculate an updated set of the quantization codewords based on the partition of the quantization space and on the average symbol error probability;
      calculate an updated partition of the quantization space into regions using the updated set of quantization codewords;
      repeat the calculation of the updated set of the quantization codewords and the updated partition of the quantization space until a threshold is met; and
      configure the quantizer to perform quantization, after the threshold is met, using the updated partition of the space and the updated set of quantization codewords.

12. The communications device claimed in claim 11, wherein the threshold is met if an incremental change in the updated codewords is smaller than a preselected value.

13. The communications device claimed in claim 11, wherein the processor is further configured to calculate distortion based on the updated quantization codewords for each iteration, and wherein the threshold is met if the incremental change in the distortion is smaller than a preselected value.

14. The communications device claimed in claim 11, wherein the processor is configured to calculate an updated set of the quantization codewords by, for each codeword, calculating the mean of the source signal within the respective region of the partitioned quantization space, and wherein the calculation of the mean of the source signal includes the average symbol error probability as a factor.

15. The communications device claimed in claim 14, wherein the processor is configured to calculate the mean of the source signal by applying a condition that each updated codeword lie within its respective $i^{th}$ region of the partitioned quantization space.

16. The communications device claimed in claim 11, wherein the processor is configured to calculate an updated set of the quantization codewords by finding, for each region i, an updated codeword $z_i$ in accordance with:

$$z_i^{(t+1)} = \frac{\int_{z \in \mathcal{A}_i^{(t)}} zf(z)dz}{p(z \in \mathcal{A}_i^{(t)}) + \frac{p_{err}}{N-1-N \cdot p_{err}}}, i = 1, \ldots, N.$$

wherein t is an index of the iteration, $p_{err}$ is the average symbol error probability, $f(z)$ is the probability density function of the source signal, $A_i^{(t)}$ is region i, and $p(z \epsilon A_i^{(t)})$ is the probability that the source signal lies within the region i.

17. The communications device claimed in claim 16, wherein the probability density function $f(z)$ is estimated from the empirical distribution of the source signal and $p(z \epsilon A_i^{(t)})$ is the percentage of the source signal in the region $A_i$.

18. The communications device claimed in claim 11, wherein the processor is configured to calculate an updated set of the quantization codewords by finding, for each region $A_i$, an updated codeword $z_i$ in accordance with:

$$z_i^{(t+1)} = \arg\min_{\hat{z} \in \mathcal{A}_i^{(t)}} \left(1 - \frac{Np_{err}}{N-1}\right) \int_{z \in \mathcal{A}_i^{(t)}} |z - \hat{z}|^2 f(z) dz + \frac{p_{err}}{N-1} |\hat{z}|^2.$$

wherein t is an index of the iteration, $p_{err}$ is the average symbol error probability, $f(z)$ is the probability density function of the source signal, $A_i^{(t)}$ is the i-th region, and $\hat{z}$ is any codeword in $A_i$.

19. The communications device claimed in claim 11, wherein the processor is further configured to quantize the source signal to generate a quantized source signal using the updated partition of the quantization space and the updated set of quantization codewords.

20. The communications device claimed in claim 11, further comprising an antenna and a wireless communications subsystem.

* * * * *

UNITED STATES PATENT AND TRADEMARK OFFICE
CERTIFICATE OF CORRECTION

PATENT NO.       : 8,451,912 B2                                           Page 1 of 2
APPLICATION NO.  : 13/463967
DATED            : May 28, 2013
INVENTOR(S)      : En-hui Yang It is certified that error appears in the above-identified patent and that said Letters Patent is hereby corrected as shown below:

On Title Page, In Column 2 (Other Publications), In Line 4, Delete "et ai," and insert -- et al, --, therefor.

On Title Page 2, In Column 1 (Other Publications), In Line 35, Delete "Gaussain" and insert -- Gaussian --, therefor.

In the Claims

In Column 12, In Line 57-61 (Approx.), In Claim 6, Delete

" $$z_i^{(t+1)} = \frac{\int_{z \in A_i^{(t)}} z f(z) dz}{p(z \in A_i^{(t)}) + \frac{p_{err}}{N-1-N \cdot p_{err}}}, \quad i = 1, \cdots, N.$$ "

and insert

-- $$z_i^{(t+1)} = \frac{\int_{z \in A_i^{(t)}} z f(z) dz}{p(z \in A_i^{(t)}) + \frac{p_{err}}{N-1-N \cdot p_{err}}}, \quad i = 1, \cdots, N$$ --, therefor.

In Column 13, In Line 11-13 (Approx.), In Claim 8, Delete

" $$z_i^{(t+1)} = \arg\min_{\hat{z} \in A_i^{(t)}} \left(1 - \frac{N p_{err}}{N-1}\right) \int_{z \in A_i^{(t)}} |z - \hat{z}|^2 f(z) dz + \frac{p_{err}}{N-1} |\hat{z}|^2.$$ "

and insert

-- $$z_i^{(t+1)} = \arg\min_{\hat{z} \in A_i^{(t)}} \left(1 - \frac{N p_{err}}{N-1}\right) \int_{z \in A_i^{(t)}} |z - \hat{z}|^2 f(z) dz + \frac{p_{err}}{N-1} |\hat{z}|^2$$ --, therefor.

Signed and Sealed this
Eleventh Day of November, 2014

Michelle K. Lee
*Deputy Director of the United States Patent and Trademark Office*

CERTIFICATE OF CORRECTION (continued)

In Column 14, In Line 18-21 (Approx.), In Claim 16, delete

" $z_i^{(t+1)} = \dfrac{\int_{z \in \mathcal{A}_i^{(t)}} z f(z) dz}{p(z \in \mathcal{A}_i^{(t)}) + \dfrac{p_{err}}{N-1-N \cdot p_{err}}}, \quad i = 1, \cdots, N.$ "

and insert

-- $z_i^{(t+1)} = \dfrac{\int_{z \in \mathcal{A}_i^{(t)}} z f(z) dz}{p(z \in \mathcal{A}_i^{(t)}) + \dfrac{p_{err}}{N-1-N \cdot p_{err}}}, \quad i = 1, \cdots, N$ --, therefor.

In Column 14, In Line 39-41 (Approx.), In Claim 18, delete

" $z_i^{(t+1)} = \arg\min_{\hat{z} \in \mathcal{A}_i^{(t)}} (1 - \dfrac{N p_{err}}{N-1}) \int_{z \in \mathcal{A}_i^{(t)}} |z - \hat{z}|^2 f(z) dz + \dfrac{p_{err}}{N-1}|\hat{z}|^2.$ "

and insert

-- $z_i^{(t+1)} = \arg\min_{\hat{z} \in \mathcal{A}_i^{(t)}} (1 - \dfrac{N p_{err}}{N-1}) \int_{z \in \mathcal{A}_i^{(t)}} |z - \hat{z}|^2 f(z) dz + \dfrac{p_{err}}{N-1}|\hat{z}|^2$ --, therefor.